United States Patent

Napoli et al.

[15] 3,656,030

[45] Apr. 11, 1972

[54] SEMICONDUCTOR DEVICE WITH PLURALITY OF SMALL AREA CONTACTS

[72] Inventors: Louis Sebastian Napoli, Hamilton; John Joseph Hughes, Spotswood, both of N.J.

[73] Assignee: RCA Corporation

[22] Filed: Sept. 11, 1970

[21] Appl. No.: 71,599

[52] U.S. Cl.....................317/234 R, 317/234 N, 317/234 P, 317/235 UA, 317/235 R

[51] Int. Cl...........................................H01l 3/00, H01l 5/00

[58] Field of Search..................317/234, 235, 6, 31, 5.2, 5.3, 317/5.4, 26

[56] References Cited

UNITED STATES PATENTS

| | | | |
|---|---|---|---|
| 2,680,220 | 1/1954 | Starr et al. | 317/235 |
| 3,271,636 | 9/1966 | Irvin | 317/235 |
| 3,360,851 | 1/1968 | Kahng et al. | 317/235 |
| 3,448,349 | 6/1969 | Sumner | 317/235 |
| 3,500,144 | 3/1970 | Wetterau et al. | 317/235 |

*Primary Examiner*—James D. Kallam
*Assistant Examiner*—Andrew J. James
*Attorney*—Glenn H. Bruestle

[57] ABSTRACT

A semiconductor body has an array of small metal film pads thereon. The pads are of uniform size and shape and are arranged with adjacent pads being uniformly spaced from each other. A metal terminal wire has a rounded end which fits between and contacts a plurality of the pads but is spaced from the surface of the semiconductor body so that the electrical connection between the terminal wire and the semiconductor body is through the pads.

6 Claims, 3 Drawing Figures

Patented April 11, 1972 3,656,030

INVENTORS
Louis S. Napoli &
John J. Hughes.
BY Donald S. Cohen
ATTORNEY

SEMICONDUCTOR DEVICE WITH PLURALITY OF SMALL AREA CONTACTS

BACKGROUND OF THE INVENTION

The present invention relates to a semiconductor device having a small metal to semiconductor material contact, and more particularly to an array of metal pads on a semiconductor body to which a terminal wire can be easily connected and provide a small area electrical connection between the terminal wire and the semiconductor body.

For certain types of semiconductor devices it is desirable to provide the device with a metal to semiconductor material contact which is very small in area. Among such semiconductor devices are Schottky surface barrier diodes, particularly those used in microwave applications, and tunnel diodes. In both of these types of semiconductor devices the small area metal to semiconductor material contact is desirable to achieve high impedances. Also, the semiconductor devices require means for electrically connecting the device to external circuitry. These means are usually terminal wires connected to the device.

One technique which has been used to provide both a small metal to semiconductor material contact and the means for connecting the device to outside circuitry is the use of a point contact terminal wire, i.e. a terminal wire having a fine point at one end which is in pressure contact with the surfaces of the semiconductor material. However, the point contact terminal has certain disadvantages. One problem arises from the fact that the electrical characteristics of the device using a point contact terminal are dependent on the surface state of the semiconductor material at the point of contact. However, the surface state of the semiconductor body generally varies over the surface of the body so that the electrical characteristics of the device will vary depending on where the point contact terminal contacts the body. Thus, it is difficult to make devices having uniform electrical characteristics using a point contact terminal. Also, the point contact terminal generally provides a rectifying junction with the semiconductor body. If an ohmic junction is desired, it is generally necessary to heat the device to fuse the terminal to the semiconductor body. Such fusion causes the contact between the terminal wire and the semiconductor body to spread out and become larger.

Another technique for making a metal to semiconductor material contact is to coat the surface of the semiconductor material body with a metal layer and bond a terminal wire to the metal layer. The area of the contact is then dependent on the area of the metal layer. However, as the metal layer is made smaller it becomes more difficult to bond the terminal wire to the metal layer. Thus, very small area metal films are extremely difficult to bond a terminal wire to.

SUMMARY OF THE INVENTION

A plurality of metal film pads are disposed on the surface of a semiconductor body. The pads are arranged in an array with adjacent pads being spaced apart. A metal terminal wire has a rounded end fitting between and contacting a plurality of the pads but spaced from the surface of the body.

DETAILED DESCRIPTION

Figure 1:
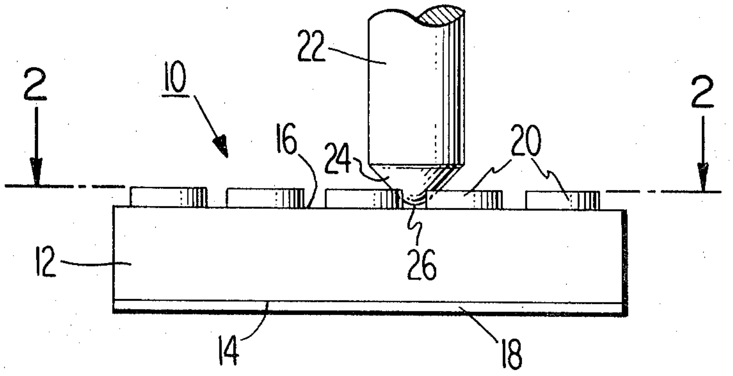
FIG. 1 is an edge plan view of one form of the semiconductor device of the present invention.
Figure 2:
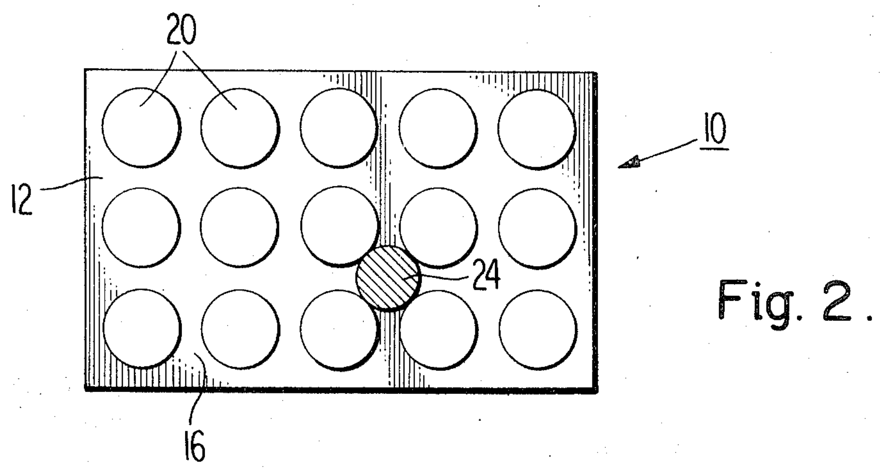
FIG. 2 is a sectional view taken along line 2—2 of FIG. 1.

Referring initially to FIGS. 1 and 2, one form of the semiconductor devices of the present invention is generally designated as 10. As shown, the semiconductor device 10 is a Schottky surface barrier diode. The semiconductor device 10 comprises a body 12 of a semiconductor material, such as silicon, germanium, or a III–V semiconductor compound, having a pair of flat, spaced, parallel surfaces 14 and 16. The surface 14 of the body 12 is coated with a metal film 18 which has an ohmic contact with the semiconductor material of the body 12. On the surface 16 of the body 12 are a plurality of metal film pads 20 preferably of uniform shape and size. The pads 20 are of a metal which forms a Schottky surface barrier junction with the particular semiconductor material of the body 12. For example, indium, tin or lead may be used on germanium; platinum silicide may be used on silicon; and nickel or a gallium-gold alloy may be used on gallium arsenide. The pads 20 are arranged on the surface 16 of the body 12 in an array preferably with the pads being uniformly spaced apart. In this form of the semiconductor device 10, the pads 20 are arranged in aligned rows and columns as shown in FIG. 2. Some of the pads 20 are contacted by a terminal wire 22 having a pointed end 24 with the apex 26 of the end being rounded. The end 24 of the terminal wire 22 extends between and contacts a plurality of the pads 20 but is spaced from the surface 16 of the body 12. As shown in FIG. 2, in this form of the semiconductor device 10, the end 24 of the terminal wire 22 can contact up to four of the pads 20. The pads 20 must be of a thickness to prevent the apex 26 of the terminal end 24 from contacting the surface 16 of the body 12. The necessary thickness of the pads 20 to achieve this is a function of the spacing between the pads 20 and the radius of the apex 26 of the terminal end 24 and can be determined by the following:

$$t > R + \left(R^2 - \frac{G^2}{4}\right)^{1/2}$$

where $t$=thickness of pads

R=the radius of the apex of the end of the terminal wire, and

G=is the diameter of the largest circle which will fit in the space between the pads and just contact the maximum number of the pads.

It can be seen from the above formula that the closer the pads 20 are to each other, i.e. the smaller the factor G, the thinner the pads 20 can be made.

Since the pads 20 are over the entire surface 16 of the body 12, the end 24 of the terminal wire 22 can be randomly placed on the body 12 and will automatically contact at least one of the pads 20. If the pads 20 are made very small in area, the terminal wire end 24 will generally fit between and contact a plurality of the pads 20. However in the particular array of the pads 20 shown in FIG. 2, the terminal wire end 24 cannot contact more than four of the pads 20. Since the electrically active metal to semiconductor material contact area is the combined area of the pads 20 engaged by the terminal wire end 24, by making each of the pads very small in area, the electrically active metal to semiconductor material area will be very small. For example, pads 20 as small as 2.5 microns have been made which provide an electrically active metal to semiconductor material contact area of about 20 square microns if the terminal wire end 24 engages four of the pads 20 as shown in FIG. 2. Thus, the semiconductor device 10 can provide a very small electrically active metal to semiconductor material contact area yet the terminal wire can be randomly brought into engagement with the pads 20 anywhere on the surface of the body 12.

Figure 3:
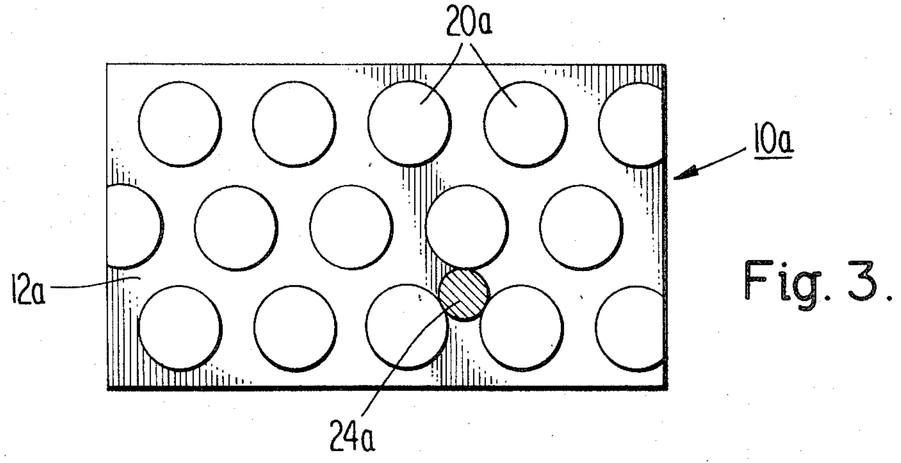
FIG. 3 is a sectional view similar to FIG. 2 but of another form of the semiconductor device.

The metal pads can be arranged in any desired array other than that shown in FIG. 2. For example, FIG. 3 shows a semiconductor device 10*a* in which the metal pads 20*a* are arranged on the semiconductor body 12*a* in rows with the pads in alternate rows being positioned between two pads of the adjacent rows. In this arrangement of the metal pads, the terminal wire end 24*a* can engage a maximum of three of the pads 20*a*. Thus, this arrangement of the metal pads will provide a smaller electrically active metal semiconductor material contact area than the arrangement shown in FIG. 2. Also, these arrangements of the metal pads can be used in a semiconductor device where a small area ohmic contact is desired between the metal pads and the semiconductor material, such as in a tunnel diode.

The metal pads can be formed on the semiconductor body by any well known technique for applying a metal layer and defining the metal layer into small areas. For example, a thin metal film is coated over the entire surface of the semiconductor body by the well known technique of vacuum evaporation. Using standard photolithographic techniques a masking layer of a resist material is then coated over the metal film with the masking layer having openings therethrough of the desired shape and size and in the desired arrangement of the metal pads. The areas of the metal film exposed by the openings in the masking layer are then coated with additional metal, such as by electroplating, until the combined thickness of the metal film and the additional metal is equal to the desired thickness of the metal pads. The masking layer is then removed with a suitable solvent and the exposed area of the metal film removed by a suitable etchant.

We claim:

1. A semiconductor device comprising a body of semiconductor material having a surface, a plurality of metal film pads of uniform shape and size on said surface of the body, said pads being arranged in an array with adjacent pads being uniformly spaced from each other, and a metal terminal wire having a rounded end fitting between and contacting a plurality of said pads with the said end of the terminal wire being spaced from said surface of the body.

2. A semiconductor device in accordance with claim 1 in which the thickness of the pads is greater than $$R+\left(R^2-\frac{G^2}{4}\right)^{1/2}$$

where

R=the radius of the rounded end of the terminal wire

G=the diameter of the largest circle fitting in the space between adjacent pads and just contacting a maximum number of the pads.

3. A semiconductor device in accordance with claim 2 in which the array of the pads extends over the entire surface of the body.

4. A semiconductor device in accordance with claim 3 in which each of the pads is circular in shape.

5. A semiconductor device in accordance with claim 3 in which each of the pads forms a surface barrier rectifying junction with the body.

6. A semiconductor device in accordance with claim 3 in which each of the pads is in ohmic contact with the body.

* * * * *